United States Patent
Desmarais et al.

(10) Patent No.: US 9,344,049 B2
(45) Date of Patent: May 17, 2016

(54) WIRELESS MICROPHONE MUTE CONTROL OVERRIDE

(71) Applicants: Mark Desmarais, Northborough, MA (US); Timothy D Root, Nashua, NH (US)

(72) Inventors: Mark Desmarais, Northborough, MA (US); Timothy D Root, Nashua, NH (US)

(73) Assignee: RevoLabs, Inc., Sudbury, MA (US)

( * ) Notice: Subject to any disclaimer, the term of this patent is extended or adjusted under 35 U.S.C. 154(b) by 163 days.

(21) Appl. No.: 14/223,126

(22) Filed: Mar. 24, 2014

(65) Prior Publication Data

US 2015/0244336 A1    Aug. 27, 2015

Related U.S. Application Data

(60) Provisional application No. 61/944,347, filed on Feb. 25, 2014.

(51) Int. Cl.
*H03G 3/00* (2006.01)
*H03G 1/02* (2006.01)

(52) U.S. Cl.
CPC ........................ *H03G 1/02* (2013.01)

(58) Field of Classification Search
None
See application file for complete search history.

(56) References Cited

U.S. PATENT DOCUMENTS

| | | | | |
|---|---|---|---|---|
| 8,311,196 | B2* | 11/2012 | Hanson | H04M 3/56 379/201.01 |
| 2007/0009118 | A1* | 1/2007 | Kimura | H04R 27/00 381/172 |
| 2007/0149246 | A1* | 6/2007 | Bodley | H04R 3/005 455/556.1 |
| 2010/0080382 | A1* | 4/2010 | Dresher | H04M 1/6033 379/421 |

* cited by examiner

*Primary Examiner* — Regina N Holder
(74) *Attorney, Agent, or Firm* — Robert Schuler

(57) ABSTRACT

An audio system is configured to support a number of wireless microphones, and each of the wireless microphones has one or more touch sensitive mute switches and a touch sensitive mute guard band switch. The mute guard band switch is connect to an electrically conductive surface that is proximate to a microphone peripheral surface that a user is likely to touch when they move the microphone. Logical instructions running in conjunction with a DSP associated with the microphone cause the audio system to override any mute commands it receives from any of the mute switches during the time that the guard band switch is activated.

22 Claims, 5 Drawing Sheets

WIRELESS MICROPHONE MUTE CONTROL OVERRIDE

1. FIELD OF THE INVENTION

The present disclosure relates to an audio processing system having wireless microphones with touch sensitive muting switches and a touch sensitive mute override arrangement.

2. BACKGROUND

Large meetings conducted either locally or in two separate locations with at least one of the locations involving two or more individuals can be facilitated using an audio system such as a room audio system or an audio conferencing system. Such audio systems typically include some number of wired or wireless microphones, at least one wired or wireless loudspeaker and a base station which can be connected to a local or wide area communication network. In such an audio system, microphones can operate to pick up acoustic energy corresponding to speech from a near side speaker and to transmit audio signals to a base station which generally operates to provide session control and to process the audio signals in a number of ways before sending it to either a local loud speaker or to a remote audio conferencing device to be played. Among other things, the base station can be configured with functionality to amplify audio signals, to regulate microphone signal gain (automatic gain control or AGC), to suppress noise, and it can be controlled to mute an audio signal captured by one or more microphones associated with a local or remote audio system.

FIG. 1 is a diagram showing functional elements comprising a an audio system 100. The audio system can be designed to operate locally in a meeting room setting, or it can be designed to transmit audio to a remote audio system over a network, in which case it can be an audio conferencing system. Regardless, the system 100 can be comprised of a number of wireless or wired microphones 120A-120C, one or more loudspeakers 110, and a server or base station 105. The wireless microphones generally operate to capture local acoustic energy information (voice and background energy) and send the acoustic information as an audio signal to the base station 105 which processes it in some manner before either transmitting the audio signal over a WAN to a remote audio system or sending over a LAN to a local audio system to be played.

Typically, in a room audio system, the loudspeakers 110 can be wired to the base station 105, and the base station is comprised of complex digital signal processing and audio signal control functionality. More specifically, the base station can include functionality to automatically control near side audio signal gain, functionality to control microphone sensitivity, audio signal muting, and system mode control (duplex/half duplex modes) to name only a few. Typically, both wired and wireless microphones include some sort of mechanism by which they can be muted. This mechanism can be a mechanical switch, or it can be any type of touch sensitive/capacitive switch positioned in a location on the microphone that permits a user to easily activate the switch to mute the microphone.

3. BRIEF DESCRIPTION OF THE DRAWINGS

The present invention can be best understood by reading the specification with reference to the following figures, in which.

4. CROSS REFERENCE TO RELATED APPLICATIONS

Figure 1:
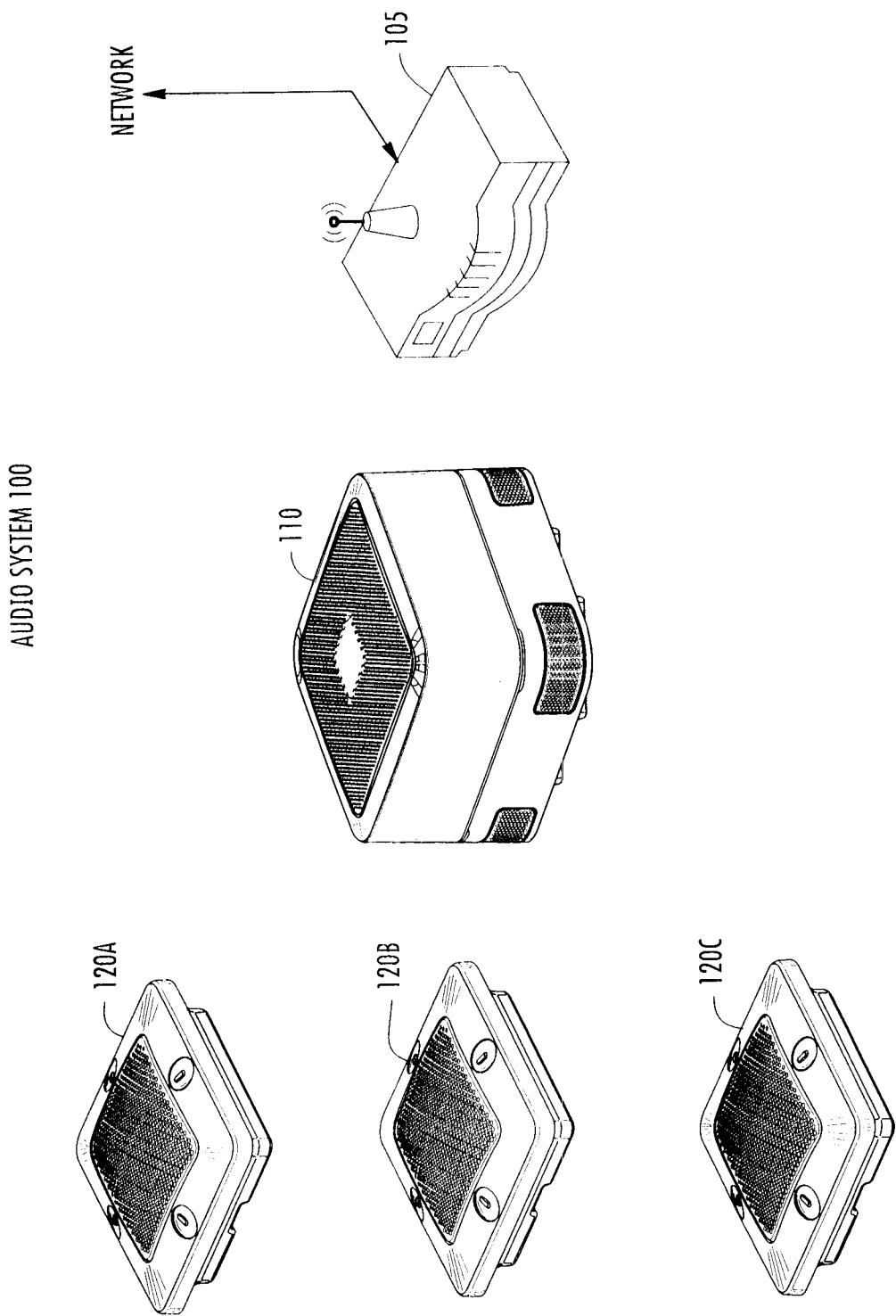
FIG. 1 is a diagram showing an audio system 100.

This application claims the benefit under 35 U.S.C. §119 (e) of U.S. Provisional Patent Application Ser. No. 61/944,347 entitled "WIRELESS MICROPHONE MUTE CONTROL OVERRIDE", filed Feb. 25, 2014, the entire contents of which is incorporated herein by reference.

5. DETAILED DESCRIPTION

The primary advantage of an audio system that supports wireless microphones is that participants in an audio session (conference or meeting) enjoy the freedom of moving around during a session while carrying a microphone that is unfettered by wires, or in the case that a wireless microphone is designed to rest on a table top, users have the freedom to position the microphone in an optimal location on the table top to capture the local audio energy. Currently, wireless microphones can include a touch sensitive switch to control the microphone mute function. Designing a wireless microphone with this type of switch has the advantage of the switch operating with much less effort/touch pressure and it has the advantage of being more reliable than a mechanical type switch. On the other hand, and depending upon the location of a touch sensitive mute switch on a wireless microphone, a microphone user may inadvertently touch the mute switch while moving the microphone from one location to another on a table-top, resulting in any audio signal picked up by the microphone at that time being muted.

One solution to this problem is to position a touch sensitive mute switch in a location on the exterior of a wireless microphone such that the switch is not likely to be touched/activated by a session participant (individual) during the time the microphone is active and is being moved. A disadvantage in positioning a touch sensitive mute switch in this manner is that it can be unwieldy for a user to activate the mute functionality when necessary.

In order to resolve this problem, and according to one embodiment, an electrically conductive element is disposed proximate to substantially an entire perimeter edge surface of a wireless microphone housing exterior that an microphone user (individual) can touch in order to move the microphone from one place to another on a table-top. The electrically conductive element is connected to a touch sensitive switch, which when activated generates a signal (microphone movement signal) that is used by the audio system to override the functionality of one or more touch sensitive mute switches located on the microphone housing. The table-top wireless microphone is designed such that it is only practical for a user to move the microphone by contacting/touching one or more locations corresponding to the perimeter edge surface of the microphone housing, and the electrically conductive element is disposed proximate to substantially the entire perimeter edge surface comprising the microphone housing. A wireless microphone designed in this manner effectively eliminates the possibility that a mute switch accidently activated by a user during the course of moving the microphone from one place to another will cause the audio system to mute (local or remote audio system to not play) an audio signal captured by the wireless microphone.

Figure 2:
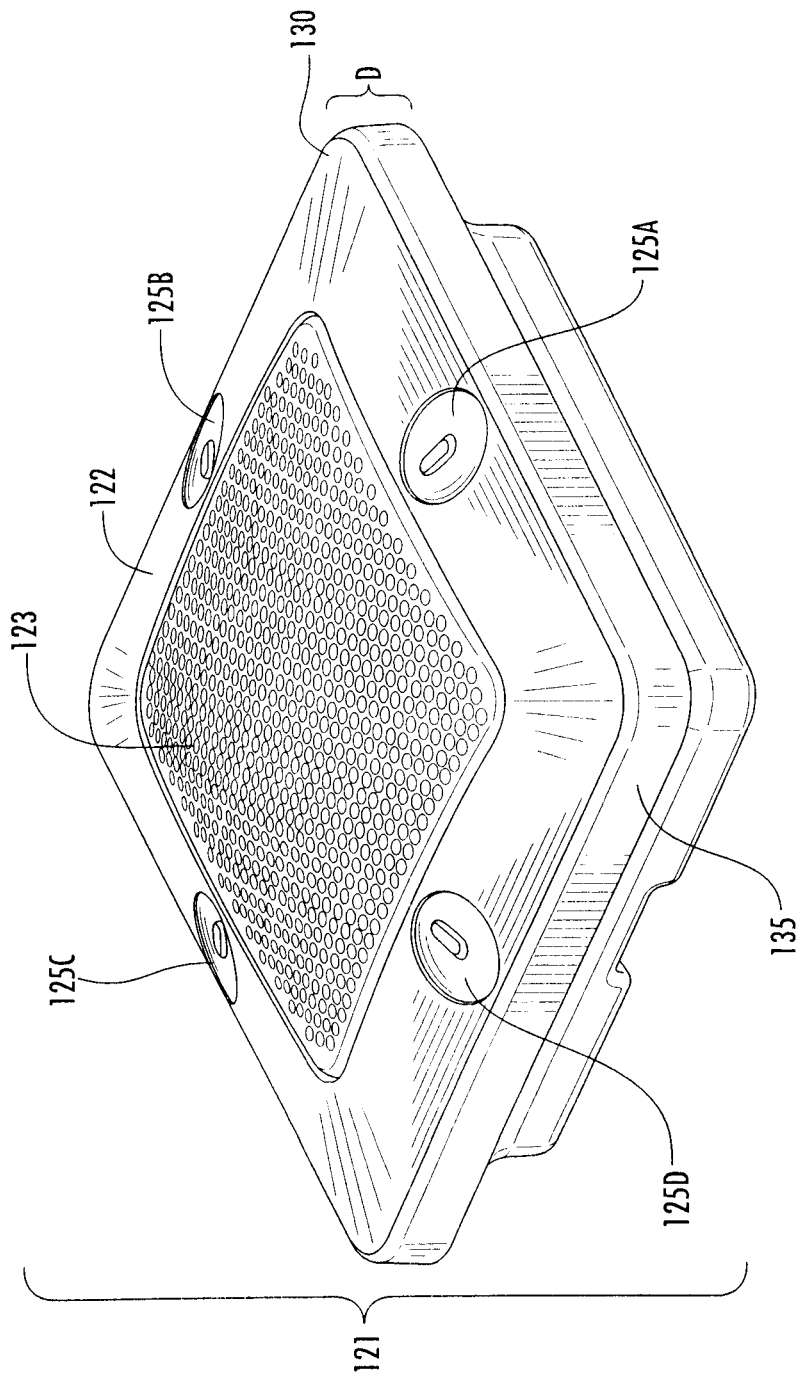
FIG. 2 illustrate an embodiment of a wireless microphone housing 120.

FIG. 2 illustrates an embodiment of a wireless microphone 120 having the electrically conductive element described earlier. For the purpose of this description, the electrically conductive element is referred to as a guard band, as the purpose of this element is to prevent or guard against the microphone being accidentally muted. The microphone 120 is comprised of a microphone housing 121 that can be composed of any appropriate lightweight material, such as a plastic material or any light weight synthetic material that can be easily molded or fabricated. The microphone housing 121 encloses a non-conductive substrate upon which are mounted functional elements necessary for the microphone operation. The non-conductive substrate and the functional elements mounted thereon will be described later with reference to FIG. 3. The housing 121 geometry according to this embodiment is substantially square in shape when viewed from a top surface 122, and the top surface is slightly convex in shape when viewed from any side of the microphone. A microphone transducer grill 123 is positioned in the middle if the top surface 122 of the housing 121, and the top surface 122 of the microphone has four touch sensitive mute switch location indicators 125A-125D, each of which indicators are positioned proximate to a top surface outer edge 130 that defines the entire outer perimeter of the top surface 122 of the microphone housing 121. Alternatively, the mute switch location indicators 125A-125D (and therefore the corresponding mute switches) can be located at any convenient position on the top surface 122 of the housing 121, and do not necessarily need to be positioned proximate to the top surface outer edge 130 of a microphone. The microphone perimeter edge surface described earlier is labeled 135 and subtends from the entire perimeter of the outer edge 130 of the microphone. This surface 135 has a width dimension "D" that can be of any suitable dimension that permits the microphone 120 to be easily handled by a user for movement from one location to another.

While FIG. 2 shows a microphone housing top surface 122 geometry that is square in shape, the geometry is not limited to only a square shape as this geometry can be round, triangular or any other shape that can be easily handled by a user for movement of the microphone. Also, the perimeter surface 135 geometry is not limited to the configuration shown in FIG. 2, but it can be wider or more narrow and is generally designed so that the microphone can be easily handled for movement by a user. Regardless, the microphone housing 121 encloses a non-conductive substrate or simply substrate 300, shown with reference to FIG. 3, upon which are mounted functional electronic elements that are necessary for the operation of the wireless microphone 120. Mounted on the substrate 300 are four touch sensors 305A-305D, a touch guard band sensor 306 connected to a guard band trace 310, a touch sensor controller means 315, and a transceiver device 320 which is referred to herein as the radio 320. The combination of the sensors and the controller operate like a switch, such that a sensor detects the proximity of a users body and sends proximity information (i.e., an electrical property such as capacitance) to the controller which determines whether the sensor is active or not. Accordingly, in some embodiments, a single switch can replace the combination of a sensor and the controller. The touch sensitive functionality can be implemented in a number of different ways, any one or which may be suitable. Hereinafter, the combination of the four touch sensors 305A-305D are referred to as a touch sensitive mute switch, and the touch guard band sensor 306 is referred to as a touch sensitive guard band switch.

Figure 3:
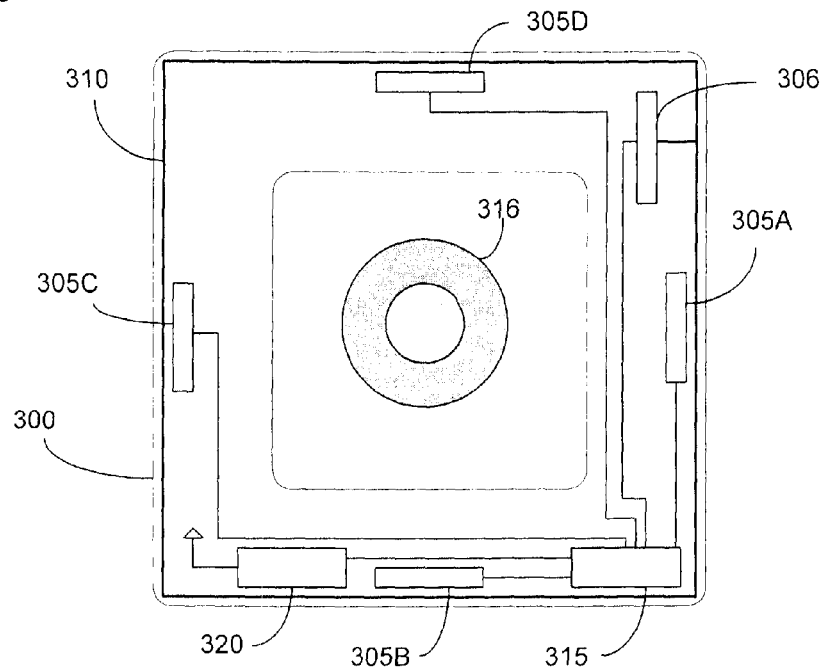
FIG. 3 is a diagram showing the positioning of functional element comprising the microphone 120 on a substrate.

Continuing to refer to FIG. 3, each of the touch sensitive mute switches 305A-305D operate to sense the proximity of a users body to the switch, and depending upon the sensitivity level to which the switch is set, the user may not need to actually come in contact with the sensor, or they may have to come in contact with the sensor for the switch to be activated. Activation according to this description means that the switch detects that it's associated sensor is being touched, or detects that some part of a users body is proximate to the sensor, and as a result the switch generates a signal indicating that it is activated. The sensitivity level of the switch can be set at the controller 315 by adjusting a threshold parametric value (resistance, capacitance, frequency, conductance) to be a greater or lesser value. For a capacitive touch sensitive switch, if a switch parametric value is measured to be greater than the threshold value, then the switch is determined to be inactive, and if the measured parametric value is less than the threshold value, the switch is determined to be active. The switch parametric value can be measured at the touch sensitive switch, or it can be measured at the controller/DSP 315. Regardless, if the measured switch value indicates that it is active, the controller can generate a mute signal that is transmitted by the radio 320 to the base station 105 which uses the mute signal to cause (employing a processor means) any acoustic energy captured by the microphone to not be played (muted) locally, or if the audio signal is transmitted to a remote audio system, causing the audio captured by the microphone to not be played (muted) by the remote audio system. The processor means can be a DSP, a general purpose processor or any computer processing device or functionality suitable to perform the function of causing the audio signal to be muted. The touch sensitive switch 306 connected to the guard band trace 310 operates to sense human contact or proximity to the guard band trace 310, when a user touches or is close to touching the trace 310, parametric information is transmitted to the controller 315 which uses this information to determine if information in the signal is greater than a pre-set threshold value, and if so, the controller generates a microphone mute override signal that is transmitted by the radio 320 to the base station 105 which either the a local audio system or a remote audio system can use to override any concurrent microphone mute signal. FIG. 3 also shows a microphone transducer 316 which operates to detect acoustic energy proximate to it and convert the acoustic energy into an audio signal that is sent to a processing device (not shown), such as a codec, that converts the audio signal into a format that permits it to be transmitted to the base station. While in this case, the transducer 316 is not attached to the substrate 300, but rather is attached to a bottom surface of the microphone 120, it is included here as it is an essential functional element of the microphone.

The substrate 300 in FIG. 3 is mounted inside the microphone housing 121 such that the perimeter edge of the substrate is very close to the perimeter surface 135 of the housing. The guard band trace 310 is fabricated as closely as possible to the perimeter edge of the substrate 300. Once assembled inside the housing, the guard band trace 310 is positioned very close to the perimeter surface 135, and in this position the guard band trace is, depending upon the sensitivity level of the switch to which it is connected, able to sense whether or not a user is touching the perimeter surface 135 or not. Due to the proximity of the touch sensitive mute switches to the microphone perimeter surface 135, it is possible that when a user is moving/re-positioning the microphone from one location to another they may also inadvertently come close enough to one of the touch sensitive mute switches 305A-305D to activate one or more of the switches. In this case the system 100 will operate to mute the audio captured by this microphone. According to one embodiment, if the touch sensitive switch 306 is activated, and if at the same time any of the switches 305A-305D are also activated, then the DSP 315 operates to not generate a microphone mute signal, and any audio information captured by the microphone during this time is played.

Figure 4:
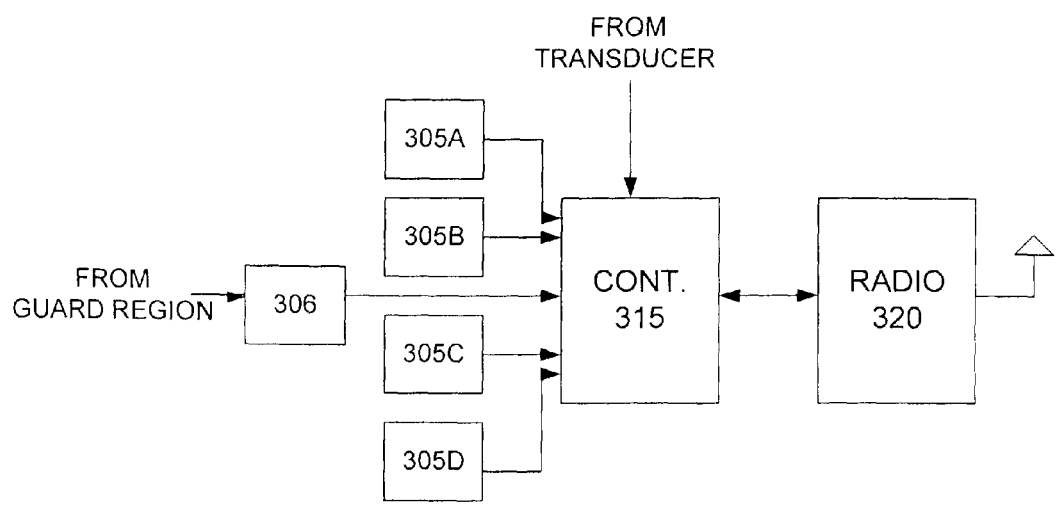
FIG. 4 is a block diagram showing functional elements comprising a wireless microphone 120.

FIG. 4 is block diagram showing the microphone functional elements described earlier with reference to FIG. 3. This Figure shows the touch sensitive switch 306 being electrically connected to the guard band trace 310 and being electrically connected to the controller 315, and each of four touch sensitive switches 305A-305D are electrically connected to the controller 315. According to the embodiment described with reference to FIG. 4, only a single guard band trace 310 extends around the perimeter of the substrate 300 and is connected to only a single touch sensitive switch 306, but it should be understood that the invention is not limited to this embodiment. More than one guard band trace can be included on the substrate, and each trace may or may not extend around the entire perimeter of the substrate. For instance, one guard band trace can extend around a first half of the substrate perimeter and a second guard band trace can extend around a second half of the substrate. Further, each guard band trace may be connected to the same touch sensitive switch or different touch sensitive switches. Still further, the guard band trace may not be laid out on the substrate, rather is can be attached to the microphone housing 121 for instance. Regardless of the guard band configuration, it is optimal that the guard band be proximate to the perimeter surface 135 of the microphone.

Each of the touch sensitive switches 306 and 305A-305D can be implemented in a capacitive touch sensor device which operates to sense a capacitance inherent in the human body. This type of sensor can be implemented as an RC oscillator running at some nominal frequency, and when the sensor is touched this nominal frequency will change (it will drop assuming that the added capacitance is a parallel capacitance). When one of the switches detects that the nominal frequency drops below a selected threshold value, it will generate and send a microphone movement signal (logical one for instance) to the audio system with which it is associated. Alternatively, a selected frequency threshold value for each or all of the touch sensitive switches can be stored on the controller and the selected threshold value for each switch can be adjusted at the controller. If the controller receives an active signal from any of the sensors 305A-305D, then it will generate a microphone mute signal that is transmitted by the radio 320 to the base station 105 described in FIG. 1. On the other hand, if the controller receives an active signal from the sensor 306, then it will generate a microphone mute override signal that is transmitted by the radio 320 to the base station 105 causing the base station to override any mute signals it receives from the microphones 305A-305D for as long as the sensor 306 is touched. Alternatively, and in another embodiment, the controller can receive frequency information from each of the touch sensitive switches and determine whether the frequency is higher or lower than a threshold value (a value lower than the threshold can indicate that a sensor was touched). According to this embodiment, the controller 315 is configured with a threshold value/adjustment function and logical instructions that is uses to process the signals it receives from each of the sensors 306 and 305A-305D in order to determine whether an audio signal captured by a microphone should be muted or not. The threshold function and logical instructions are described below with reference to FIG. 5.

Figure 5:
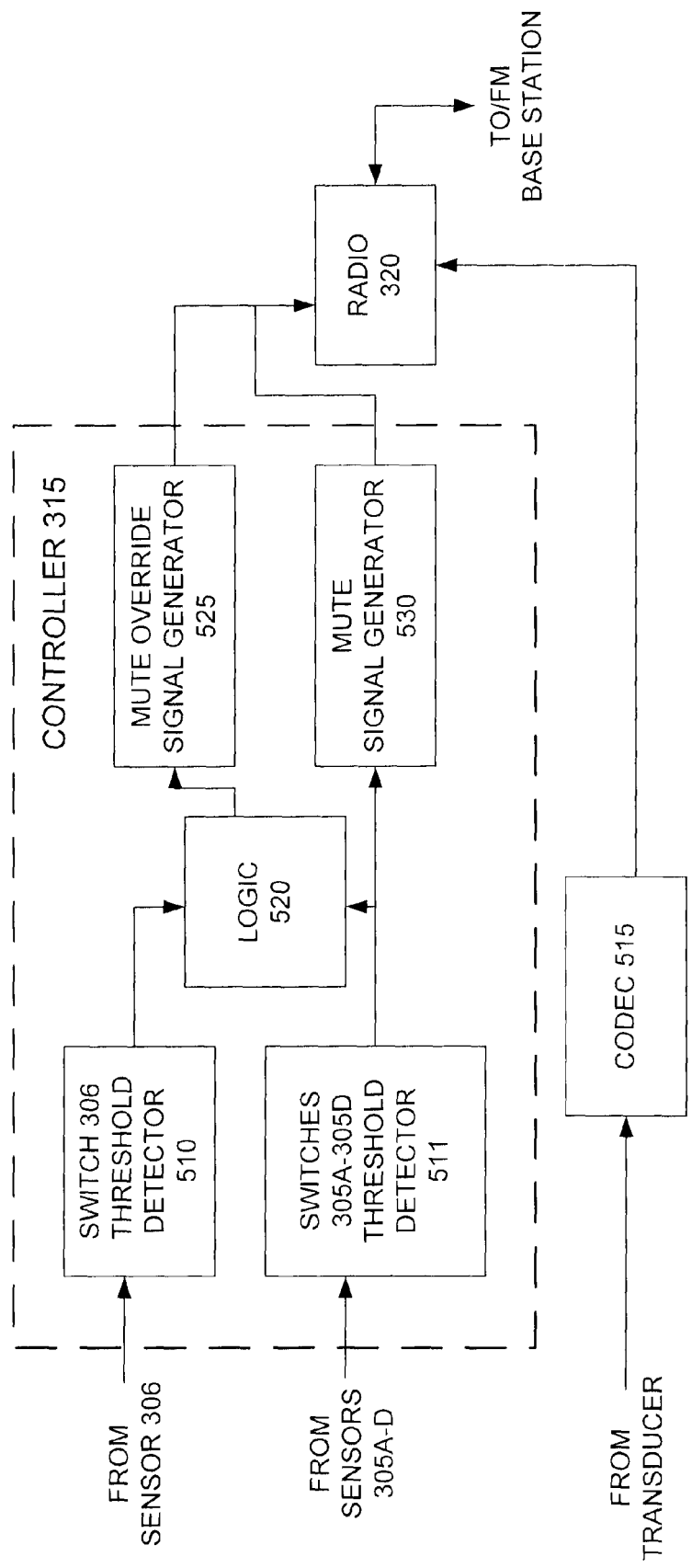
FIG. 5 is a block diagram showing functionality in a DSP 315 that implements an embodiment of the invention.

FIG. 5 is a diagram illustrating the functional elements comprising the controller DSP 315 that can be employed to enable the microphone mute override functionality described earlier. The controller 315 is shown with separate touch sensitive switch activity threshold detectors 510 and 511 that operate to respectively receive information from the switch 306 and the switches 305A-305D, and a threshold value can be set and/or adjusted at each detector according to the needs of the system 100. A threshold value in this case can be a frequency value or any other value that can be set or adjusted in relation to similar capacitive touch switches. According to one embodiment of the invention, the threshold value for the detector 510 is set such that the switch 306 is relatively more sensitive than the switches 305A-305D, and conversely, the threshold value for the detector 511 is set such that the switches 305A-305D are relatively less sensitive than switch 306. For example, if the nominal operating frequency of an oscillator running in each of the capacitive touch switches is 50 Hz, then the threshold value for detector 510 can be set to a frequency, 45 Hz for instance, that is an indication that the user has touched the microphone in a location that is proximate to, but does not necessarily correspond to, the guard band surface 135, and the threshold value for detector 511 can be set to 40 Hz, or set to some threshold frequency that is an indication that the user has positively touched one of the touch sensitive switch location indicators 125A-125D. When threshold values are set in this manner, the system 100 is more likely to correctly react to a microphone being moved by overriding a mute signal. More specifically, if a microphone is active and being moved at the same time, it is important that the system 100 is able to reliably determine that the microphone is being moved, and to react by not muting the microphone audio signal if a user inadvertently touches one of the switches 305A-305D. So, setting the threshold value for switch 306 to be more sensitive than the other switches increases the likelihood that the system 100 will detect this microphone movement.

Continuing to refer to FIG. 5, the threshold detectors 510 and 511 operate to receive, in this case, frequency information in a signal sent to them by each of the touch sensitive switches. In the event that detector 511 determines that one of the touch sensitive switches 305A-305D is active, it generates and sends a signal to both logic instructions 520 and to a mute signal generator 530. The logic 520 operates on signals received from both detectors 510 and 511 to determine whether or not the system 100 should mute the microphone audio signal. The logical instructions can be implemented as a logical AND operation, where the operating has two inputs, it can have one input from the detector 510 and another input from the detector 511. In operation, if only the detector 511 output is active, then the logic 520 would not cause the override signal generator to send an override signal and only the mute signal generator 530 sends a mute control signal to the base station 105. However, in the event that detector 510 determines that switch 306 is active, and at the same time detector 511 determines that any one or more of the switches 305A-305D are also active, the logic 520 receives a signal from each detector indicating concurrent activity in these switches and determines that the microphone is both being used and being moved at the same time. In this case, the logic 520 sends a signal to the mute override signal generator 525 which generates a microphone mute override signal that is sent to the system 100, and the system 100 responds by not permitting the microphone to be muted for at least as it is determined that the microphone is in motion, which in this case is as long as the override signal is active.

For the purpose of this description, it is assumed that the microphone 120 is active when it is operating to capture acoustic energy and to transmit a resulting audio signal over an assigned channel to a base station 105. In addition to transmitting audio signals to the base station 105, the wireless microphone 120 also operates to generate control signals, such as a mute signal and a mute override signal. The operation of the wireless microphone to generate both of these signals and the use of these signals by the system 100 to play or to not play audio captured by the microphone is described below with reference to FIG. 6.

Figure 6:
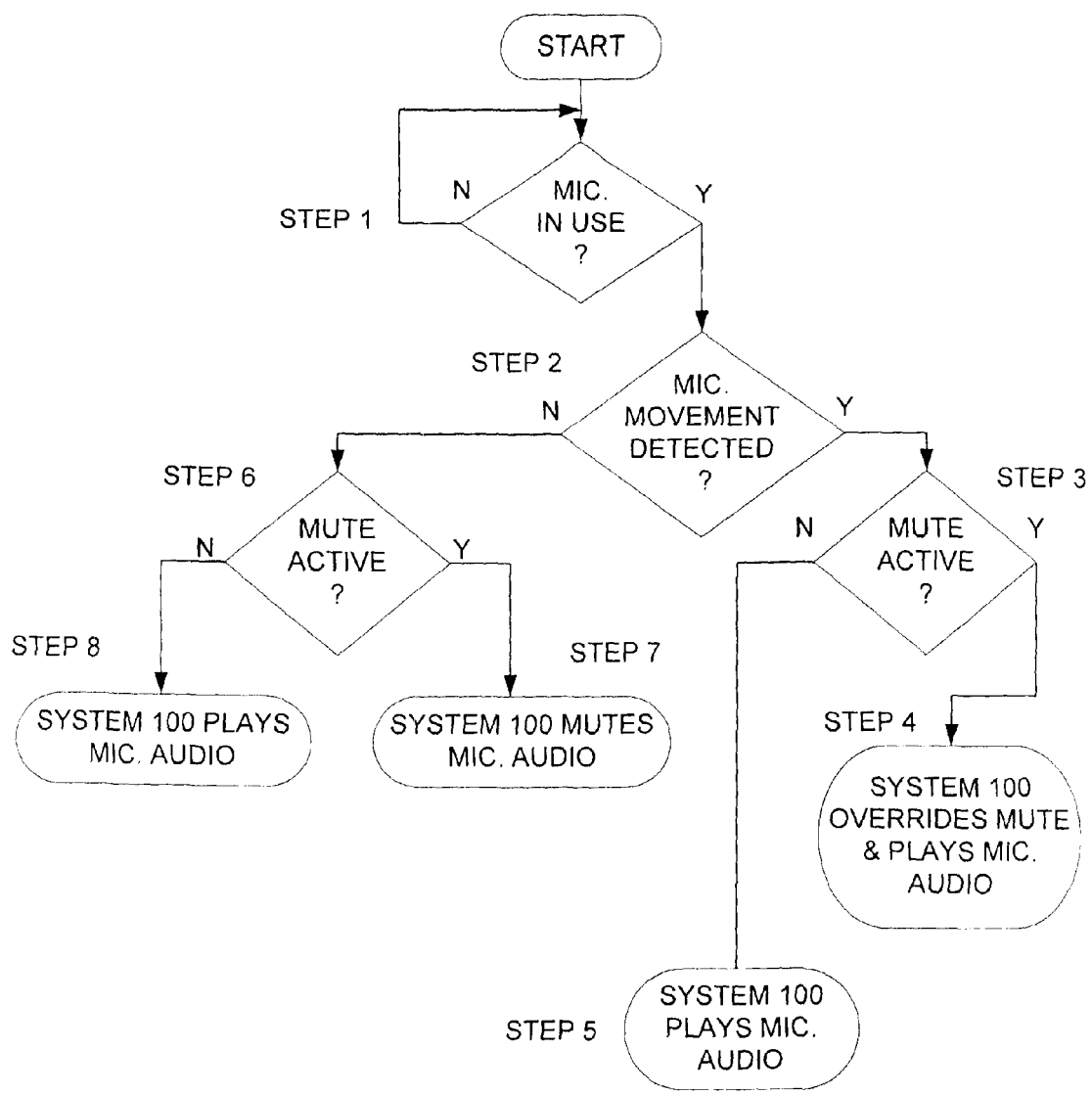
FIG. 6 is a logical flow diagram of the method of the invention.

FIG. 6 is a flow diagram illustrating logical decisions made during the time the wireless microphone 120 is actively being used. Subsequent to the microphone transitioning to an active state in Step 1, in Step 2 if (and for as long as) the logic 520 receives an indication from detector 510 that the guard band switch 306 is active, it determines that the microphone is being moved and the process proceeds to Step 3. In Step 3 the logic determines if any of the mute switches 305A-305D are active or not, and if so the logic causes the signal generator 525 to send an override signal to the base station 105 which ultimately causes the system 100 to, in Step 4, override the mute signal (generated by the mute signal generator 530). If in Step 3 none of the mute switches are active, then the system 100 operates to, in Step 5, play audio signals received from the microphone in the normal manner.

Returning to Step 2, if the logic determines that there is no microphone movement, then the process proceeds to Step 6, and if in this Step the logic determines that any one of the mute switches are active, then the process proceeds to Step 7 and the system 100 causes audio signals received from the microphone to be muted. On the other hand, if in Step 6 the logic determines that none of the mute switches are active, then the process proceeds to Step 8 and the system 100 causes audio signals received from the microphone to be played in the normal manner.

The forgoing description, for purposes of explanation, used specific nomenclature to provide a thorough understanding of the invention. However, it will be apparent to one skilled in the art that specific details are not required in order to practice the invention. Thus, the forgoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

We claim:

1. A wireless microphone associated with an audio system, comprising:
    an acoustic energy transducer, a touch sensor control device and a transceiver enclosed by a microphone housing, the microphone housing having a top surface and a top surface edge extending around its entire outer perimeter from which subtends a microphone perimeter surface, the entire microphone perimeter surface is in proximity to an electrically conductive element comprising a touch sensitive guard band switch that when active is an indication that an individual is touching the wireless microphone;
    the top surface of the microphone housing having at least one touch sensitive mute switch that when active causes an audio system in communication with the wireless microphone to mute an audio signal sent to it by the wireless microphone, both the touch sensitive guard band switch and the touch sensitive mute switch are connected to the touch sensor control device; and
    while the wireless microphone is active, the touch sensor control device operating to detect that both the touch sensitive guard band switch and the at least one touch sensitive mute switch are active at the same time and causing the audio system to prevent a wireless microphone audio signal it receives from being muted.

2. The wireless microphone of claim 1, wherein the at least one touch sensitive mute switch is disposed proximate to the top surface edge.

3. The wireless microphone of claim 1, wherein the touch sensitive guard band switch when active is an indication that the microphone is being handled by a user or is in motion.

4. The wireless microphone of claim 1, further comprising first processor means on the wireless microphone for detecting touch sensitive guard band switch activity.

5. The wireless microphone of claim 4, wherein the first processor means comprises a guard band switch activity threshold detector and a mute switch activity threshold detector.

6. The wireless microphone of claim 5, wherein a threshold value selected for the guard band switch activity threshold detector is higher than a threshold value selected for the mute switch activity threshold detector.

7. The wireless microphone of claim 6, wherein the threshold values for each of the guard band switch activity threshold detector and the mute switch threshold activity detector is a frequency value.

8. The wireless microphone of claim 1, wherein the electrically conductive element is fabricated on a non-conductive substrate and is disposed continuously around the entire perimeter of the non-conductive substrate.

9. The wireless microphone of claim 8, wherein the perimeter edge of the non-conductive substrate is proximate the microphone perimeter surface.

10. The wireless microphone of claim 5, wherein the guard band switch is detected to be active if a frequency value received at the guard band switch activity threshold detector is less than the selected threshold value, and the at least one mute switch is detected to be active if a frequency value received at the mute switch activity threshold detector is less than a selected threshold value.

11. The wireless microphone of claim 1, wherein the touch sensor control device comprises a set of logical computer instructions and a mute override signal generator.

12. The wireless microphone of claim 11, wherein the set of logical computer instructions receives a guard band switch activity signal and a mute switch activity signal during a time period and controls the mute override signal generator to send a mute override control signal to the transceiver which operates to send the control signal to the audio system.

13. The wireless microphone of claim 1 is suitable for resting on a flat, horizontal surface.

14. A method for overriding a microphone mute control signal, comprising:
    receiving at an audio system a mute override control signal from a wireless microphone, the mute override control signal being generated by a touch sensitive guard band switch comprising the wireless microphone that is activated as the result of the wireless microphone being handled by a user, the touch sensitive guard band switch is connected to an electrically conductive element that is proximate to an entire perimeter surface of the wireless microphone; and while the wireless microphone is active, the audio system using the mute override control signal to prevent a wireless microphone audio signal from being muted during the time that the guard band switch is active.

15. The method of claim 14, wherein at least one touch sensitive mute switch is disposed proximate to the top surface edge.

16. The method of claim 14, wherein the touch sensitive guard band switch when active is an indication that the microphone is in motion.

17. The method of claim 14, wherein a guard band switch activity detection means comprises a guard band switch activity threshold detector and a mute switch activity threshold detector.

18. The method of claim 17, wherein a threshold value selected for the guard band switch activity threshold detector is higher than a threshold value selected for the mute switch activity threshold detector.

19. The method of claim 18, wherein the threshold values for each of the guard band switch activity threshold detector and the mute switch threshold activity detector is a frequency value.

20. The method of claim 14, wherein the guard band switch is detected to be active if a frequency value received at the guard band switch activity threshold detector is less than the selected threshold value, and the at least one mute switch is detected to be active if a frequency value received at the mute switch activity threshold detector is less than a selected threshold value.

21. The method of claim 14, wherein the audio system is controlled to override the wireless microphone mute control signal by a set of logical computer instructions and a mute override signal generator.

22. The method of claim 21, wherein the set of logical computer instructions receives a guard band switch activity signal and a mute switch activity signal during the same time period and controls the mute override signal generator to send a mute override control signal to the audio system.

* * * * *